US011601051B2

(12) United States Patent
Yu et al.

(10) Patent No.: US 11,601,051 B2
(45) Date of Patent: Mar. 7, 2023

(54) CONNECTION TERMINAL PATTERN AND LAYOUT FOR THREE-LEVEL BUCK REGULATOR

(71) Applicant: QUALCOMM Incorporated, San Diego, CA (US)

(72) Inventors: Chengyue Yu, San Diego, CA (US); Zhen Ning Low, San Diego, CA (US); Guoyong Guo, San Jose, CA (US); Jiwei Chen, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 164 days.

(21) Appl. No.: 16/444,844

(22) Filed: Jun. 18, 2019

(65) Prior Publication Data

US 2020/0403514 A1    Dec. 24, 2020

(51) Int. Cl.
| | |
|---|---|
| *H02M 3/156* | (2006.01) |
| *G06F 1/3287* | (2019.01) |
| *H01L 23/50* | (2006.01) |
| *H01L 23/00* | (2006.01) |
| *H02M 3/07* | (2006.01) |
| *H02M 3/158* | (2006.01) |
| *H02M 7/483* | (2007.01) |
| *H02M 1/00* | (2006.01) |

(52) U.S. Cl.
CPC .......... *H02M 3/156* (2013.01); *G06F 1/3287* (2013.01); *H01L 23/50* (2013.01); *H01L 24/01* (2013.01); *H02M 3/07* (2013.01); *H02M 3/1582* (2013.01); *H02M 7/483* (2013.01); *H01L 2924/1306* (2013.01); *H01L 2924/15311* (2013.01); *H01L 2924/19042* (2013.01); *H02M 1/0003* (2021.05); *H02M 1/009* (2021.05); *H02M 3/1586* (2021.05)

(58) Field of Classification Search
CPC ...... H02M 3/1582; H02M 3/07; H02M 7/483; G06F 1/3287; H01L 23/50; H01L 24/01
See application file for complete search history.

(56) References Cited

U.S. PATENT DOCUMENTS

| | | | | |
|---|---|---|---|---|
| 9,595,871 | B1* | 3/2017 | Bayer | H02M 3/1582 |
| 10,014,778 | B1* | 7/2018 | Wei | H02M 1/08 |
| 10,734,898 | B1* | 8/2020 | Arnold | H02M 1/088 |

(Continued)

OTHER PUBLICATIONS

Texas Instruments: "bq25910EVM-854 Evaluation Module," User's Guide, SLVUB31A—Sep. 2017—Revised Mar. 2018, 20 pages.

(Continued)

*Primary Examiner* — Nguyen Tran
(74) *Attorney, Agent, or Firm* — Patterson & Sheridan, LLP

(57) ABSTRACT

Certain aspects of the present disclosure generally relate to a connection terminal pattern and layout for a three-level buck regulator. One example electronic module generally includes a substrate, an integrated circuit (IC) package disposed on the substrate and comprising transistors of a three-level buck regulator, a capacitive element of the three-level buck regulator disposed on the substrate, and an inductive element of the three-level buck regulator disposed on the substrate. In certain aspects, the capacitive element and the inductive element may be disposed adjacent to different sides of the IC package.

16 Claims, 8 Drawing Sheets

(56) References Cited

U.S. PATENT DOCUMENTS

| | | | | |
|---|---|---|---|---|
| 2014/0306673 A1* | 10/2014 | Le | .......................... | H02M 3/156 |
| | | | | 323/266 |
| 2014/0307493 A1* | 10/2014 | Chevalier | ............... | H02M 3/07 |
| | | | | 363/60 |
| 2016/0118961 A1* | 4/2016 | Nagasato | ........... | H03K 17/6872 |
| | | | | 318/504 |
| 2016/0190921 A1* | 6/2016 | Kumar | .................. | H02M 3/158 |
| | | | | 323/271 |
| 2016/0329734 A1* | 11/2016 | Lee | ....................... | H02M 3/156 |
| 2016/0352218 A1* | 12/2016 | Stauth | ..................... | H02M 1/08 |
| 2017/0300107 A1* | 10/2017 | Green | ................. | G06F 1/3287 |
| 2018/0019669 A1* | 1/2018 | Zhang | .................. | H02M 3/073 |
| 2018/0226890 A1* | 8/2018 | Dai | .................... | H02M 3/1582 |

OTHER PUBLICATIONS

International Search Report and Written Opinion—PCT/US2020/033088—ISA/EPO—Aug. 13, 2020.

* cited by examiner

From t2 to t3:

From t3 to t4:

CONNECTION TERMINAL PATTERN AND LAYOUT FOR THREE-LEVEL BUCK REGULATOR

TECHNICAL FIELD

Certain aspects of the present disclosure generally relate to electronic circuits and, more particularly, to a connection terminal pattern and layout for a three-level buck regulator.

BACKGROUND

A voltage regulator ideally provides a desired direct current (DC) output voltage regardless of changes in load current or input voltage. Also known as power converters, voltage regulators may be classified as either linear regulators or switching regulators. While linear regulators tend to be small and compact, many applications may benefit from the increased efficiency of a switching regulator. A switching regulator may be implemented by a switched-mode power supply (SMPS), such as a buck converter, a boost converter, or a charge pump converter.

Power management integrated circuits (power management ICs or PMICs) are used for managing the power requirement of a host system. A PMIC may be used in battery-operated devices, such as mobile phones, tablets, laptops, wearables, etc., to control the flow and direction of electrical power in the devices. The PMIC may perform a variety of functions for the device, such as DC-to-DC conversion, battery charging, power-source selection, voltage scaling, power sequencing, etc.

SUMMARY

Certain aspects of the present disclosure generally relate to electronic circuits and, more particularly, to a connection terminal pattern and layout for a three-level buck regulator.

Certain aspects of the present disclosure provide an electric module. The electric module generally includes a substrate, an integrated circuit (IC) package disposed on the substrate and comprising transistors of a three-level buck regulator, a capacitive element of the three-level buck regulator disposed on the substrate, and an inductive element of the three-level buck regulator disposed on the substrate, the capacitive element and the inductive element being disposed adjacent to different sides of the IC package.

Certain aspects of the present disclosure provide an IC package. The IC package generally includes at least one first connection terminal for coupling to a first terminal of a capacitive element of a three-level buck regulator, the at least one first connection terminal being located at a first side of a terminal pattern of the IC package; at least one second connection terminal coupled to a switching node of the three-level buck regulator, the at least one second connection terminal being located at a second side of the terminal pattern; at least one third connection terminal for coupling to a second terminal of the capacitive element, the at least one third connection terminal being located at the first side of the terminal pattern; and an IC comprising a first transistor coupled between an input voltage (VIN) node and the at least one first connection terminal; a second transistor coupled between the at least one first connection terminal and the at least one second connection terminal; a third transistor coupled between the at least one second connection terminal and the at least one third connection terminal; and a fourth transistor coupled between the at least one third connection terminal and a reference potential node of the three-level buck regulator.

Certain aspects of the present disclosure provide a method for voltage regulation. The method generally includes selectively coupling, via a plurality of transistors of a three-level buck regulator, a capacitive element between a switching node and a voltage rail or a reference potential node, the plurality of transistors being integrated in an IC package on a substrate; and generating an output voltage at an output node of the three-level buck regulator having an inductive element coupled between the switching node and the output node, the capacitive element and the inductive element being disposed adjacent to different sides of the IC package.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a terminal pattern (e.g., ball grid array (BGA) pattern) of an integrated circuit (IC) package implementing a three-level buck regulator. Certain aspects also provide a layout of capacitive and inductive elements adjacent to different sides of the IC package as allowed by the terminal pattern described herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

Figure 1:
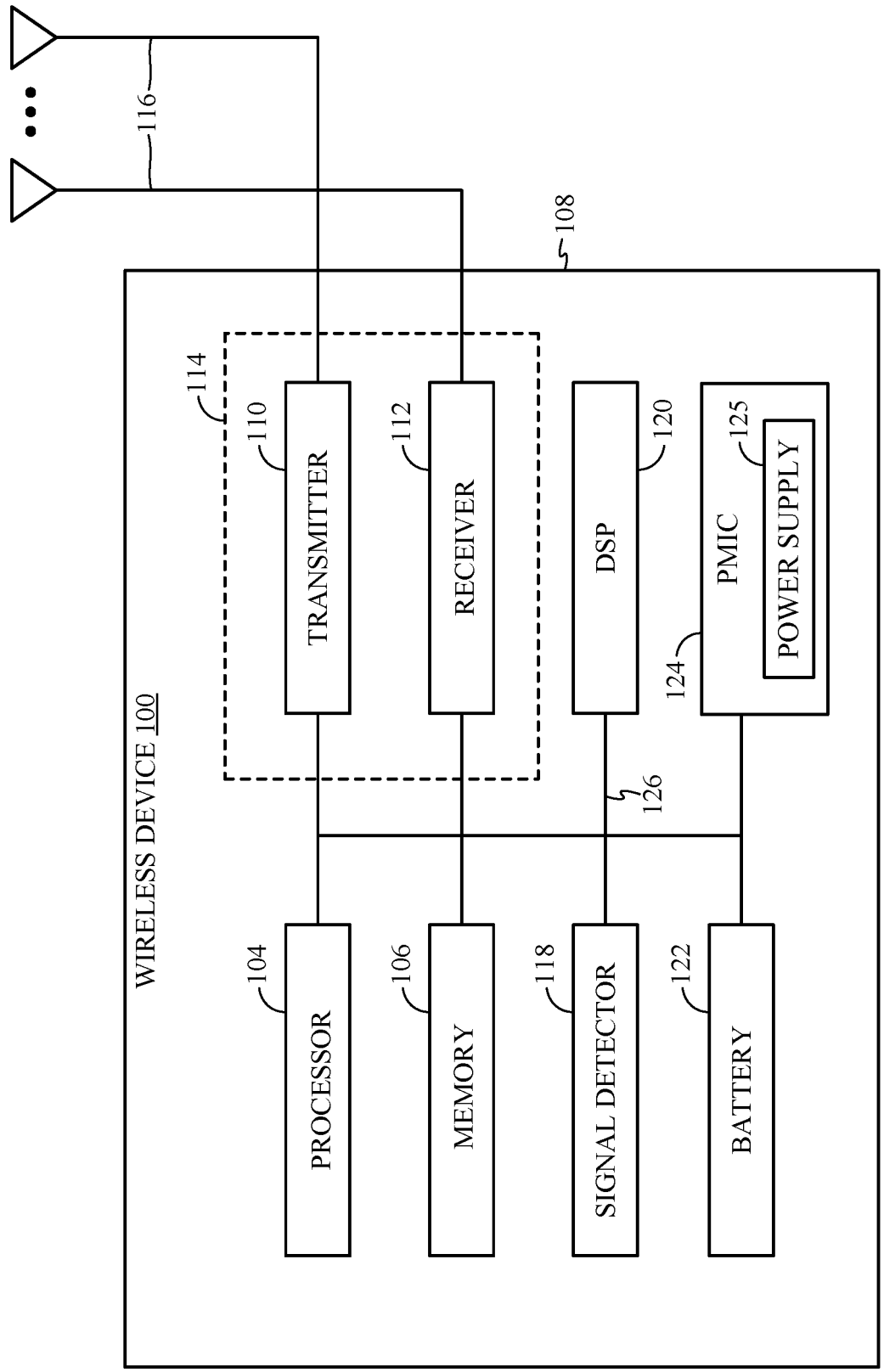
FIG. 1 illustrates an example device in which aspects of the present disclosure may be implemented.

FIG. 1 illustrates an example device 100 in which aspects of the present disclosure may be implemented. For example, the device 100 may be a battery-operated portable device, such as a cellular phone, a personal digital assistant (PDA), a handheld device, a wireless device, a laptop computer, a tablet, a smartphone, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include a power supply circuit 125, such as a three-level buck regulator, as described in more detail herein. The various components of the device 100 may be coupled together by a bus system 126, which may include a power bus, a control signal bus, and/or a status signal bus in addition to a data bus.

Example Connection Terminal Pattern and Layout for Three-Level Buck Regulator

Certain aspects of the present disclosure are generally directed to a terminal pattern (e.g., ball grid array (BGA) pattern) of an integrated circuit (IC) package implementing a three-level buck regulator. Certain aspects also provide a layout of capacitive and inductive elements adjacent to different sides of the IC package as allowed by the terminal pattern described herein. A three-level buck regulator generally refers to a direct-current (DC)-to-DC regulator implemented using a flying capacitive element (CFLY) that is selectively coupled between an inductive element and an input voltage source or reference potential node (e.g., electric ground) via switches, allowing for voltage regulation with improved power efficiency as compared to conventional buck converter implementations.

Figure 2:
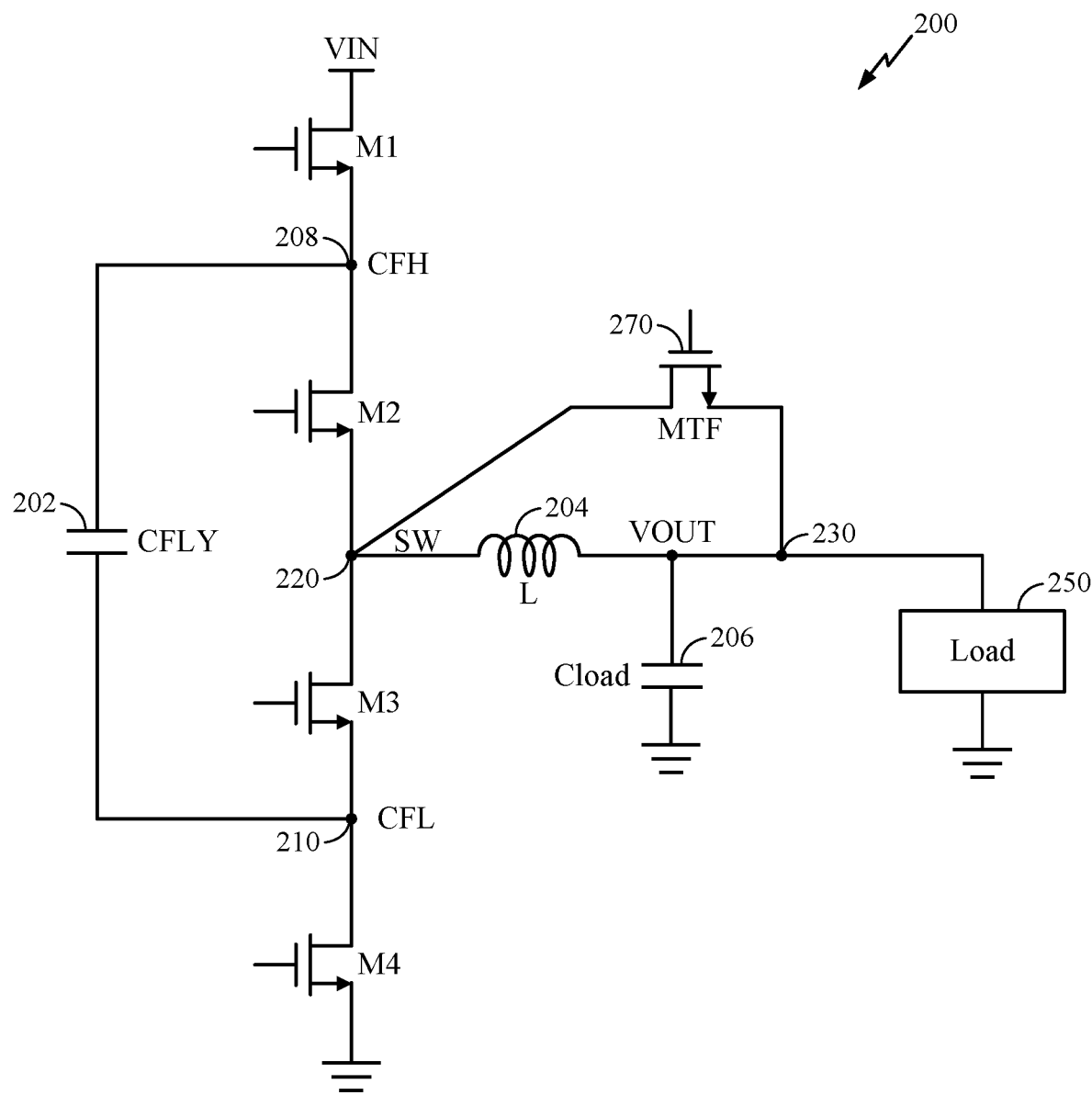
FIG. 2 is a schematic diagram of an example three-level buck regulator, in accordance with certain aspects of the present disclosure.

FIG. 2 is a schematic diagram of an example three-level buck regulator 200, in accordance with certain aspects of the present disclosure. The three-level buck regulator 200 may include CFLY 202, a first terminal of CFLY 202 being coupled to a CFLY high (CFH) node 208 and a second terminal of CFLY 202 being coupled to a CFLY low (CFL) node 210 of the three-level buck regulator 200. As illustrated, the three-level buck regulator 200 may include a switch M1 coupled between an input voltage (VIN) node and the CFH node 208, and a switch M2 coupled between the CFH node 208 and a switching (SW) node 220. The three-level buck regulator 200 may also include a switch M3 coupled between the SW node 220 and the CFL node 210, and a switch M4 coupled between the CFL node 210 and a reference potential node (e.g., electric ground), as illustrated. In certain aspects, the switches M1, M2, M3, and M4 may be implemented using field-effect transistors (FETs).

The voltage at the SW node 220 of the three-level buck regulator 200 may be at one of three voltage potentials depending on an operating condition (i.e., phase) of the three-level buck regulator 200. For example, the voltage at the SW node 220 (also referred to as "VSW" herein) may be at VIN, half the input voltage (VIN/2), or a reference potential (e.g., electric ground) depending on the duty ratio of the three-level buck regulator 200. The duty ratio refers to the ratio of the output voltage (VOUT) at the output node 230 to VIN. As illustrated, the output node 230 may be coupled to a load 250 and load capacitive element (Cload) 206. When the duty ratio of the three-level buck regulator 200 is less than 0.5, VSW may alternate between VIN/2 and the reference potential, as described in more detail with respect to FIGS. 3A-3D. When the duty ratio of the three-level buck regulator 200 is greater than 0.5, VSW may alternate between VIN and VIN/2, as described in more detail with respect to FIGS. 4A-4D.

Figure 3A:
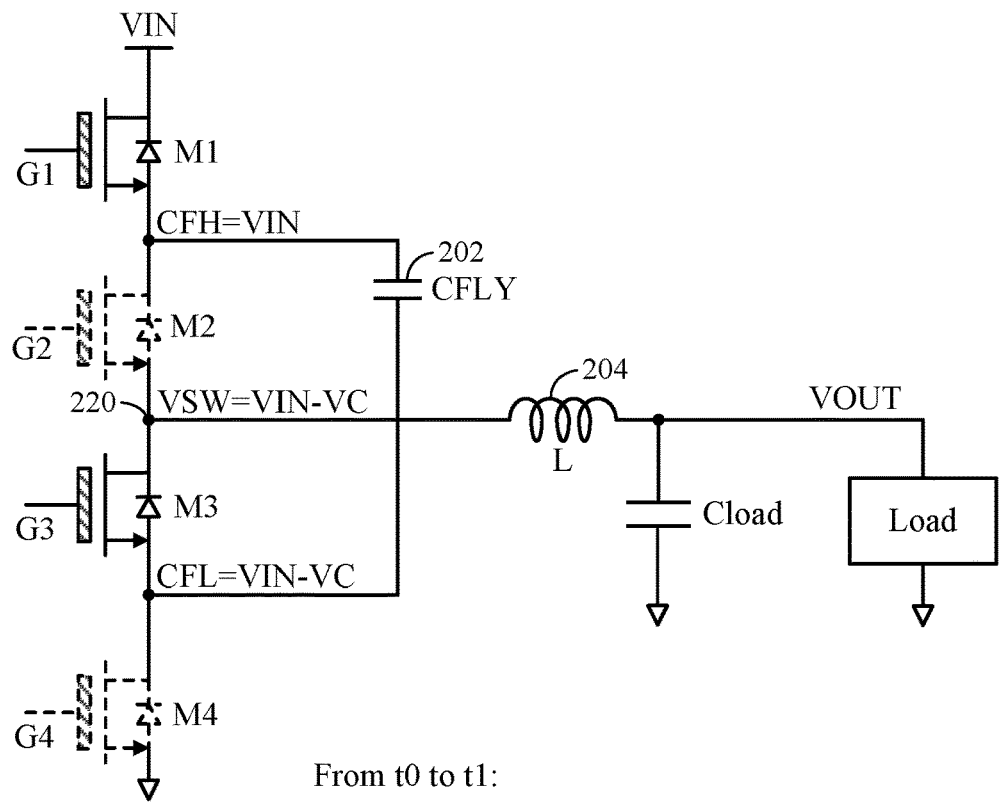
FIGS. 3A-3D illustrate configurations of switches of an example three-level buck regulator having a duty ratio of less than 0.5 for various operating phases of the regulator, in accordance with certain aspects of the present disclosure.

FIGS. 3A-3D illustrate configurations of switches of the example three-level buck regulator 200 when the duty ratio is less than 0.5 for different operating phases of the regulator, in accordance with certain aspects of the present disclosure. As illustrated in FIG. 3A, during a first period between times t0 and t1, the switches M1, M3 are closed, and switches M2, M4 are open, charging CFLY 202 and the inductive element 204 (having inductance L). Thus, the voltage at the switching node 220 (VSW) may be equal to VIN minus VC (e.g., VIN/2), where VC is the voltage across CFLY 202.

Figure 3B:
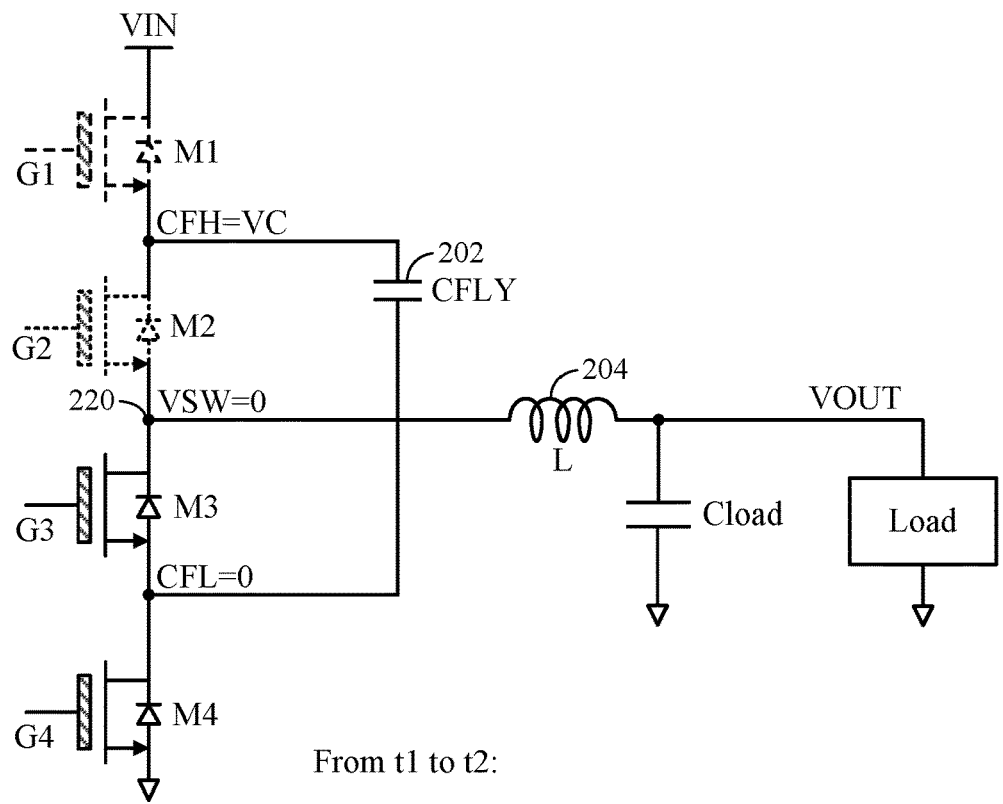

During a second period between times t1 and t2 as depicted in FIG. 3B, switches M3, M4 may be closed, and switches M1, M2 may be open, discharging the inductive element 204. Thus, VSW may be at the reference potential (e.g., electric ground) during the period between times t1 and t2.

Figure 3C:
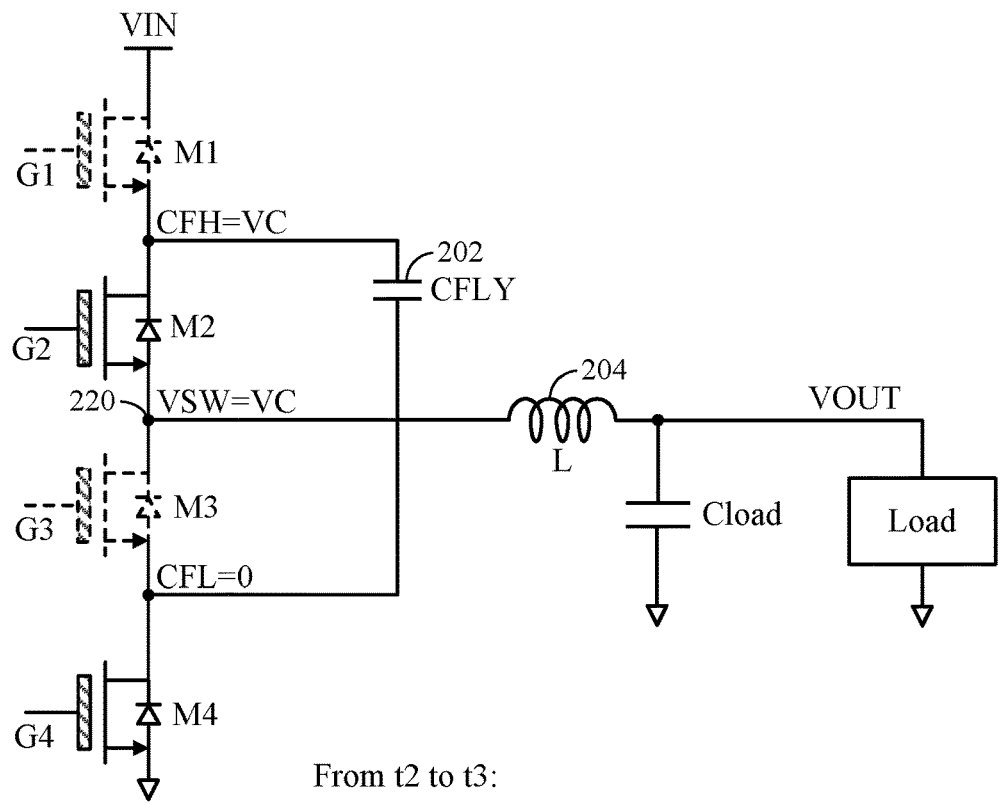

During a third period between times t2 and t3 as portrayed in FIG. 3C, the switches M2, M4 may be closed, and the switches M1, M3 may be open, discharging CFLY 202 while charging the inductive element 204. Therefore, VSW may be at VC during the third period between times t2 and t3.

Figure 3D:
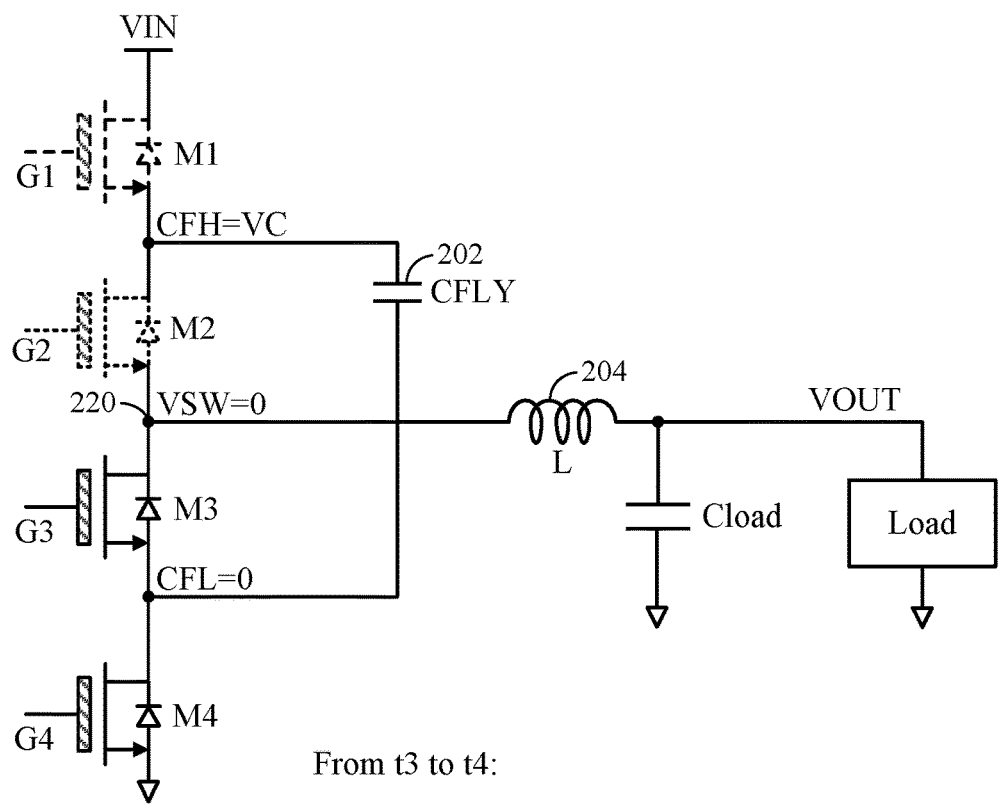

During a fourth period between times t3 and t4 as shown in FIG. 3D, the switches M3, M4 may be closed, and the switches M1, M2 may be open, discharging the inductive element 204. Therefore, VSW may be at the reference potential, similar to the second period. The duration of the first and third periods may be adjusted to regulate the output voltage VOUT when the duty ratio is less than 0.5. After the fourth period, the buck regulator may return to the first period to repeat the different operation phases.

Figure 4A:
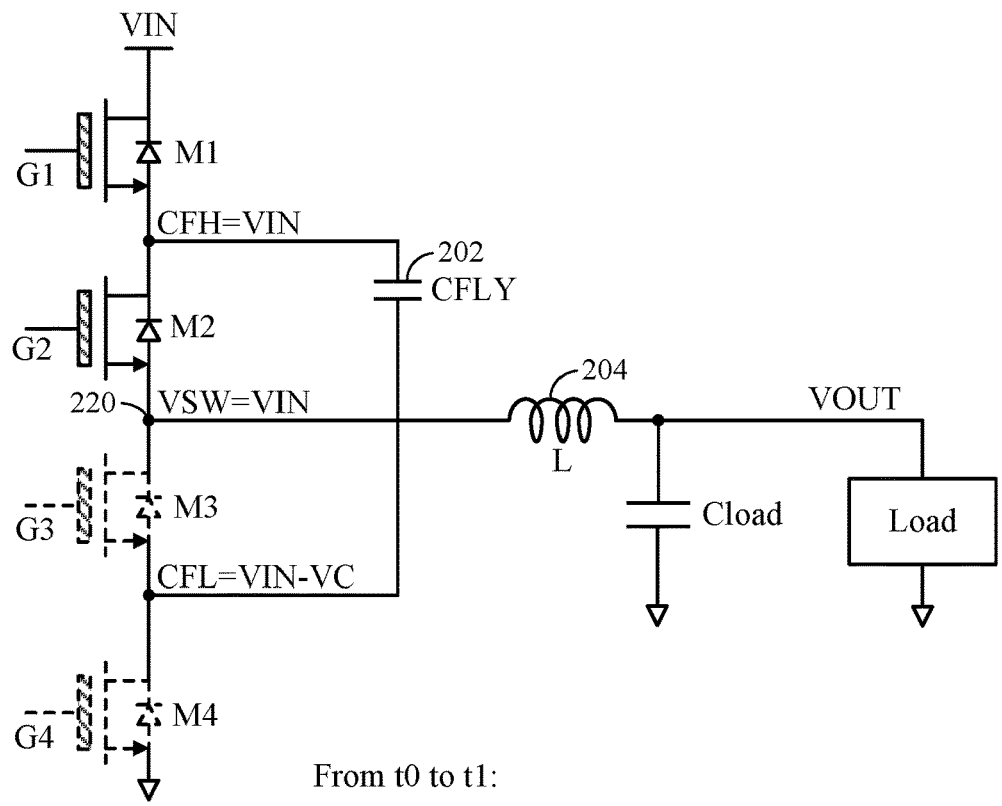
FIGS. 4A-4D illustrate configurations of switches of an example three-level buck regulator having a duty ratio of greater than 0.5 for various operating phases, in accordance with certain aspects of the present disclosure.

FIGS. 4A-4D illustrate configurations of switches of the example three-level buck regulator 200 when the duty ratio is greater than 0.5 for different operating phases of the regulator, in accordance with certain aspects of the present disclosure. As illustrated in FIG. 4A, during a first period between times t0 and t1, the switches M1, M2 are closed, and switches M3, M4 are open. Thus, VSW may be equal to VIN, charging the inductive element 204.

Figure 4B:
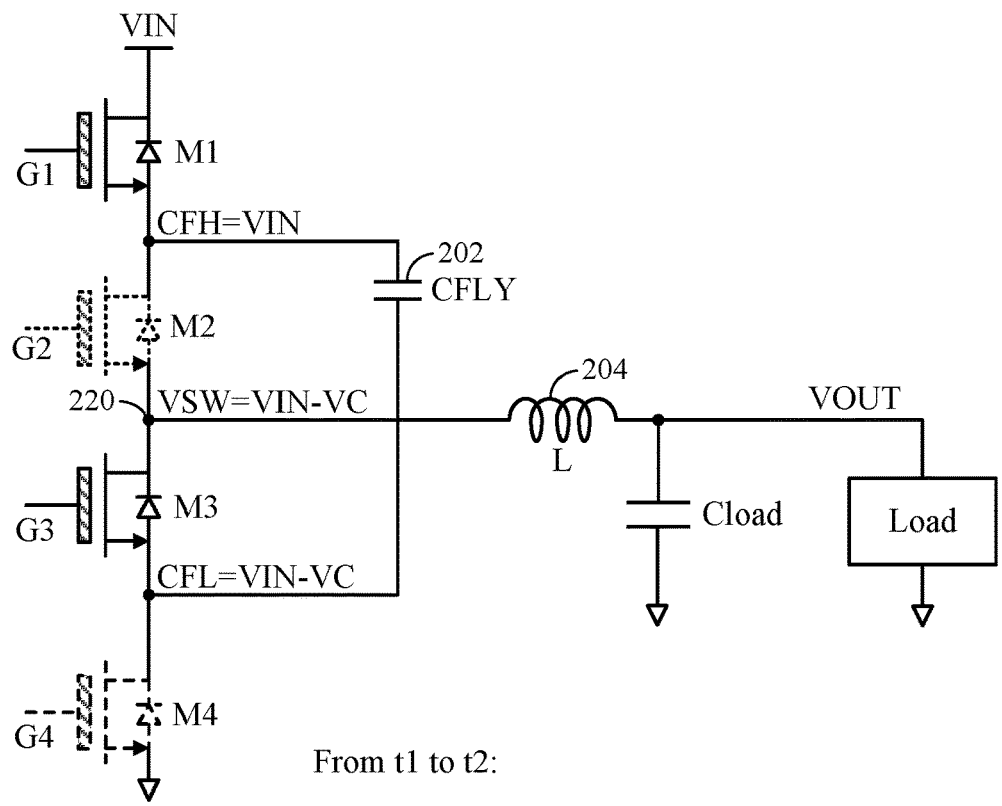

During a second period between times t1 and t2 as depicted in FIG. 4B, switches M1, M3 may be closed, and switches M2, M4 may be open. Thus, VSW may be at VIN minus VC (e.g., VIN/2) during the second period between times t1 and t2, discharging the inductive element 204.

Figure 4C:
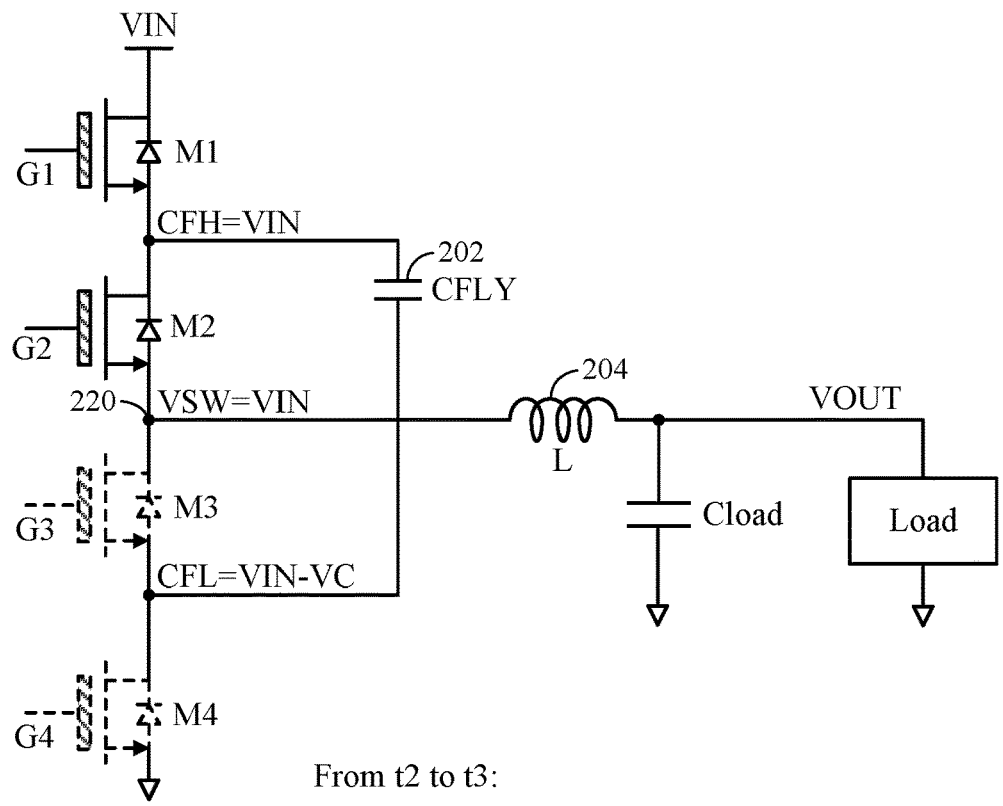

During a third period between times t2 and t3 as shown in FIG. 4C, the switches M1, M2 may be closed, and the switches M3, M4 may be open, similar to the first period. Therefore, VSW may be at VIN during the third period between times t2 and t3, charging the inductive element 204.

Figure 4D:
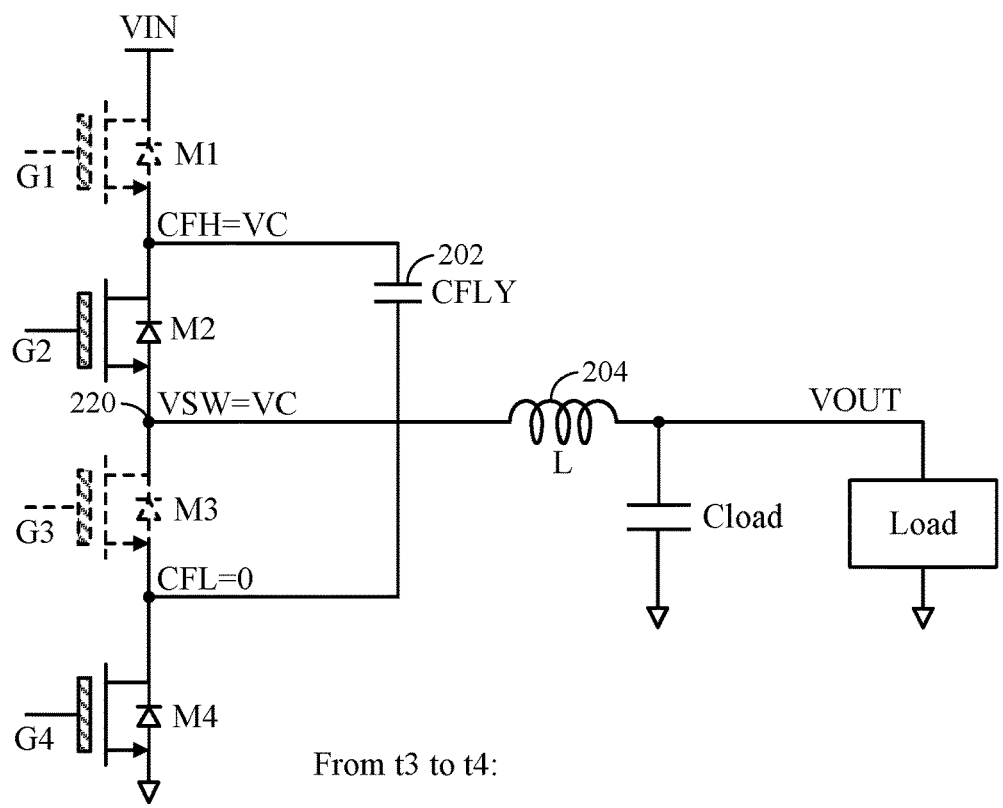

During a fourth period between times t3 and t4 as portrayed in FIG. 4D, the switches M2, M4 may be closed, and the switches M1, M3 may be open. Therefore, VSW may be at VC (e.g., VIN/2), discharging the inductive element 204. The duration of the first and third periods may be adjusted to regulate the output voltage VOUT when the duty ratio is greater than 0.5. After the fourth period, the buck regulator may return to the first period to repeat the different operation phases.

In certain aspects, the three-level buck regulator 200 may also include a mode transition FET (MTF) 270 coupled in parallel with the inductive element 204, as illustrated in FIG. 2. The MTF 270 may be operated as a switch that when closed, shorts the inductive element 204, configuring the three-level buck regulator 200 in a different mode of operation with the inductive element 204 shorted. As illustrated, a terminal (e.g., drain) of the MTF 270 is shorted to the SW node 220. However, the MTF 270 may, but need not, be located besides the inductive element 204. For example, as described in more detail herein, the MTF 270 may be integrated in an IC (e.g., PMIC 124), while the inductive element 204 may be disposed adjacent to the IC. As another example, the MTF 270 may be located remote from the inductive element 204.

In certain aspects, the switches M1, M2, M3, M4 may be integrated in the IC (e.g., PMIC 124). In some cases, CFLY 202 and the inductive element 204 may be placed adjacent to the same side of the IC and on the same layer of a substrate 590 (e.g., a printed circuit board (PCB)) on which the IC is disposed. In this case, only one of CFLY 202 and inductive element 204 may be placed directly adjacent to the IC. For example, the IC and the inductive element 204 may be disposed adjacent to opposite sides of CFLY, resulting in a relatively long trace from the SW node 220 of the IC to the inductive element 204 and increased routing resistance and parasitics. In other cases, CFLY 202 and the inductive element 204 may be disposed on separate layers of the substrate 590 on which the IC is disposed. Since the signal at the SW node 220 is a high frequency signal, the SW node 220 may couple high frequency noise onto other circuit components. Therefore, routing the SW node 220 to a separate layer may increase the noise coupling by the SW node 220. Certain aspects of the present disclosure are directed to an assignment pattern for connection terminals of the IC (e.g., PMIC 124) that allows for CFLY 202 and the inductive element 204 to be placed adjacent to different sides of the IC to allow for reduced routing resistance, parasitics, and noise coupling as compared to conventional implementations. The assignment pattern may also enable placement of CFLY 202 and the inductive element 204 on the same layer to reduce noise coupling as compared to conventional implementations.

Figure 5:
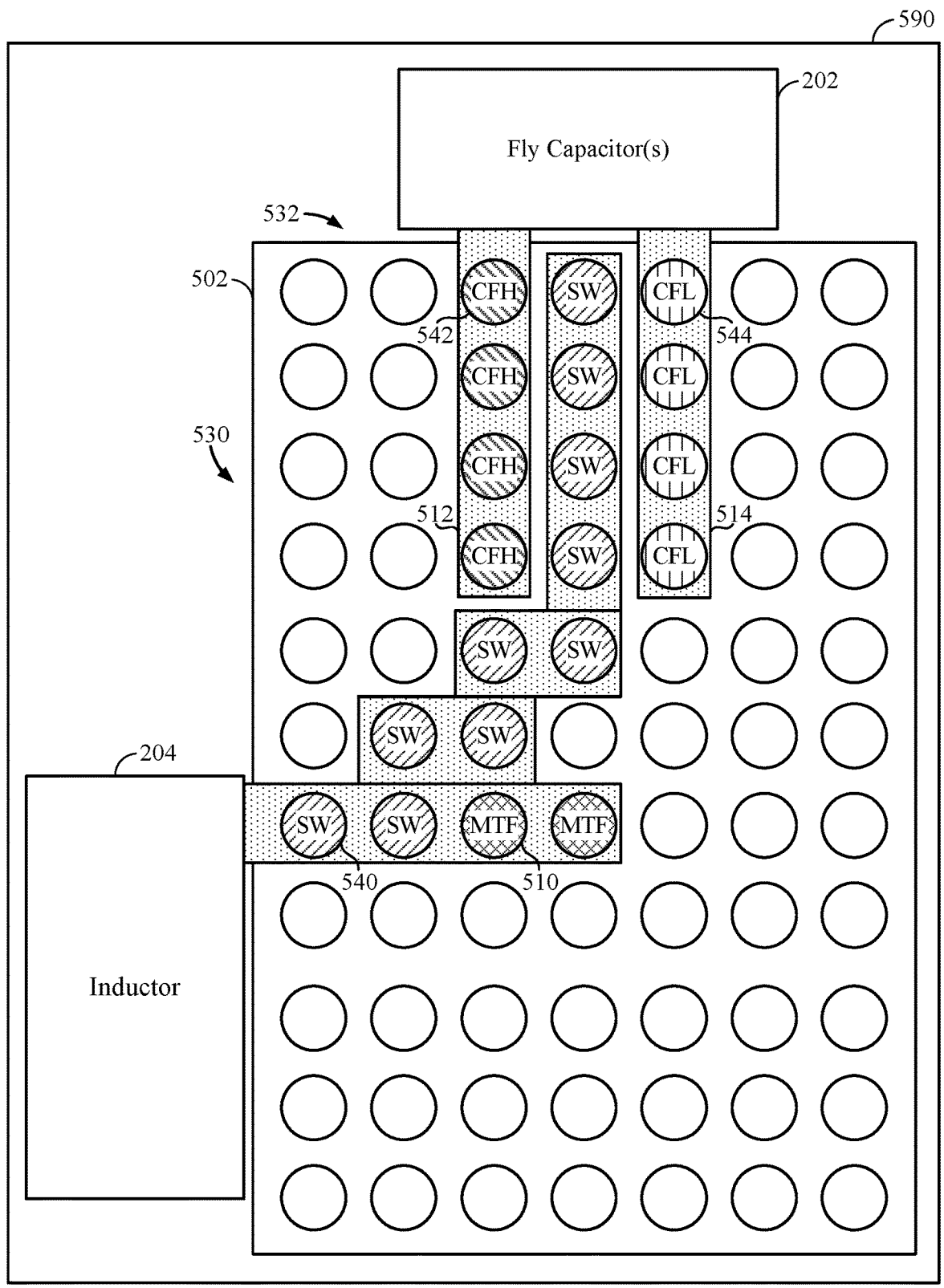
FIG. 5 illustrates an example connection terminal pattern of an integrated circuit (IC) package coupled to a capacitive element and an inductive element, in accordance with certain aspects of the present disclosure.

FIG. 5 illustrates an example connection terminal pattern (e.g., BGA pattern) of an IC package 502 coupled to CFLY 202 and an inductive element 204, in accordance with certain aspects of the present disclosure. The connection terminals (e.g., balls of the BGA) labeled "CFH" are connected (or at least assigned for connection) to the CFH node 208 described with respect to FIG. 2. The connection terminals labeled "CFL" are connected (or at least designated for connection) to the CFL node 210 described with respect to FIG. 2. The connection terminals labeled "SW" are connected (or at least allocated for connection) to the SW node 220 described with respect to FIG. 2. The connection terminals labeled "MTF" are connected (or at least assigned for connection) to the drain of the MTF 270 described with respect to FIG. 2.

As illustrated, CFLY 202 and the inductive element 204 are placed on different sides 530, 532 of the IC package 502, allowing for relatively short routing from the IC package 502 to CFLY 202 and the inductive element 204. For example, a trace 510 couples the connection terminals (e.g., ball 540 of the BGA) of the IC package 502 associated with the SW node (labeled "SW") to the inductive element 204 disposed on the left-hand side 530 of the IC package 502. Moreover, a trace 512 may couple the connection terminals for the CFH node 208 (labeled "CFH") to a first terminal of CFLY 202, and a trace 514 may couple the connection terminals for the CFL node 210 (labeled "CFL") to a second terminal of CFLY 202, as illustrated. In certain aspects, traces 510, 512, and 514 may all be disposed and completely routed on the same layer of the substrate 590. In other aspects, at least one of CFLY 202 or the inductive element 204 may be disposed on a different layer than the IC package 502. For example, the IC package 502 and the inductive element 204 may be disposed on opposite sides of the substrate 590. In this case, the connection terminals of the IC package 502 associated with the SW node may be electrically coupled to the inductive element 204 through one or more vias of the substrate 590.

The terminal pattern of the IC package 502 may include an assignment of one or more balls (e.g., ball 540) located at an edge of the side 530 of the IC package 502 to the SW node 220, allowing for the coupling of the SW node 220 to inductive element 204 located besides the IC on the side 530. Moreover, the connection terminal pattern of the IC package 502 may include an assignment of one or more balls (e.g., ball 542) located at an edge of another side 532 of the IC package to the CFH node 208, allowing for the coupling of the CFH node 208 to the first terminal of CFLY 202. The connection terminal pattern of the IC package 502 may also include an assignment of one or more balls (e.g., ball 544) located at an edge of the same side (e.g., side 532) of the IC package to the CFL node 210, allowing for the coupling of the CFL node 210 to the second terminal of CFLY 202.

As used herein, a connection terminal is considered to be located at a side of a terminal pattern of an IC package if the connection terminal can be routed to a component adjacent to the IC package without passing an active connection terminal. An active connection terminal is any connection terminal assigned to a circuit node in the IC package. As used herein, an edge of a side of a terminal pattern refers to one of the outermost rows or columns of the terminal pattern. As used herein, the outermost edge refers to a row or column at the perimeter of the terminal pattern.

The connection terminal pattern described with respect to FIG. 5 allows for CFLY 202 and inductive element 204 to be disposed adjacent to different sides 530, 532 of the IC package 502. Therefore, traces for coupling the SW node 220 to the inductive element 204 and/or the CFL and CFH nodes 208, 210 to CFLY 202 may be shorter as compared to having both CFLY 202 and inductive element 204 on the same side of the IC package 502, reducing routing resistance and parasitics. Moreover, the connection terminal pattern allows for CFLY 202 and inductive element 204 to be disposed on the same layer of the substrate 590 as the IC package 502. Therefore, the connection of CFLY 202 and inductive element 204 to respective balls of the IC package 502 may be implemented without vias for connection to separate layers, reducing noise coupling to other components.

While the examples provided herein have described a pattern for routing traces using BGA-type IC packaging to facilitate understanding, the techniques describes herein may be applied to any type of IC packaging, such as a pin grid array (PGA) or land grid array (LGA). For example, using an LGA, pins on a first side of the IC package may be assigned to the CFH and CFL nodes, and one or more pins on a second side of the IC package may be assigned to the SW node, allowing for relatively short traces to reduce routing resistance and parasitics as described herein.

Figure 6:
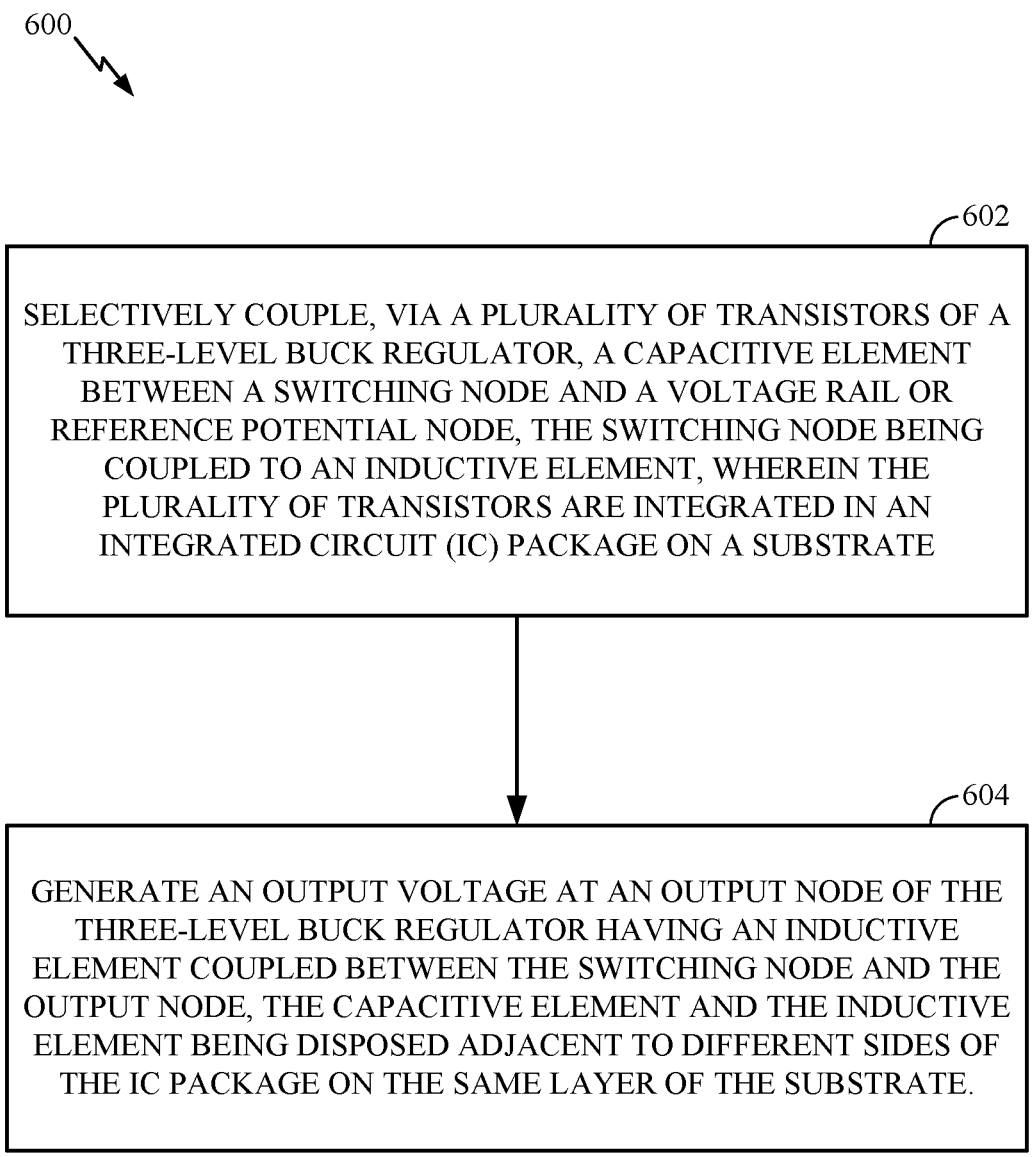
FIG. 6 is a flow diagram illustrating example operations for voltage regulation, in accordance with certain aspects of the present disclosure.

FIG. 6 is a flow diagram illustrating example operations 600 for voltage regulation, in accordance with certain aspects of the present disclosure. The operations 600 may be performed by a three-level buck regulator, such as the three-level buck regulator 200 as described herein.

The operations 600 begin, at block 602, with the three-level buck regulator selectively coupling, via a plurality of transistors (e.g., switches M1, M2, M3, and M4) of a three-level buck regulator, a capacitive element (e.g., CFLY 202) between a switching node (e.g., SW node 220) and a voltage rail (e.g., VIN) or a reference potential node, the switching node being coupled to an inductive element (e.g., inductive element 204). In certain aspects, the plurality of transistors are integrated in an IC package disposed on a substrate (e.g., substrate 590). The operations 600 also include, at block 604, the three-level buck regulator generating an output voltage (e.g., VOUT) at an output node (e.g., output node 230) of the three-level buck regulator having an inductive element (e.g., inductive element 204) coupled between the switching node and the output node. The capacitive element and the inductive element may be disposed adjacent to different sides (e.g., sides 530, 532) of the IC package. In certain aspects, the capacitive element and the inductive element may be disposed on the same layer of the substrate.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-h, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An electric module, comprising:
   a substrate;
   an integrated circuit (IC) package disposed on the substrate and comprising transistors of a three-level buck regulator;
   a capacitive element of the three-level buck regulator disposed on the substrate, wherein the capacitive element comprises a flying capacitor; and
   an inductive element of the three-level buck regulator disposed on the substrate, the capacitive element and the inductive element being disposed adjacent to different sides of the IC package, wherein:
      the different sides of the IC package comprise a first surface and a second surface, the first and second surfaces being adjacent surfaces sharing a common edge;
      an entirety of a length of the capacitive element is disposed along the first surface; and
      an entirety of a length of the inductive element is disposed along the second surface.

2. The electric module of claim 1, wherein the capacitive element and the inductive element are disposed on the same layer of the substrate.

3. The electric module of claim 1, wherein the IC package comprises:
   at least one first connection terminal coupled to a first terminal of the capacitive element via a first trace of the substrate;
   at least one second connection terminal coupled to a switching node of the three-level buck regulator and coupled to the inductive element via a second trace of the substrate; and
   at least one third connection terminal coupled to a second terminal of the capacitive element via a third trace of the substrate.

4. The electric module of claim 3, wherein:
   the at least one first connection terminal is located at a first side of a terminal pattern of the IC package;
   the at least one second connection terminal is located at a second side of the terminal pattern; and
   the at least one third connection terminal is located at the first side of the terminal pattern.

5. The electric module of claim 4, wherein:
   the IC package comprises a ball grid array (BGA) package, the terminal pattern comprising a BGA pattern of the BGA package;
   the at least one first connection terminal comprises at least one first ball located at a first outermost edge of the first side of the BGA pattern;
   the at least one second connection terminal comprises at least one second ball located at a second outermost edge of the second side of the BGA pattern; and
   the at least one third connection terminal comprises at least one third ball located at the first outermost edge of the first side of the BGA pattern.

6. The electric module of claim 4, wherein:
   the at least one first connection terminal is one of a first plurality of terminals of the IC package coupled to the first terminal of the capacitive element via the first trace, at least another one of the first plurality of terminals being located at an inner portion of the terminal pattern;
   the at least one second connection terminal is one of a second plurality of terminals of the IC package coupled to the inductive element via the second trace, at least another one of the second plurality of terminals being located at the inner portion of the terminal pattern; and
   the at least one third connection terminal is one of a third plurality of terminals of the IC package coupled to the second terminal of the capacitive element via the third trace, at least another one of the third plurality of terminals being located at the inner portion of the terminal pattern.

7. The electric module of claim 6, wherein the at least the other one of the second plurality of terminals is between the at least the other one of the first plurality of terminals and the at least the other one of the third plurality of terminals.

8. The electric module of claim 6, wherein the at least the other one of the second plurality of terminals is located at the first side of the terminal pattern.

9. The electric module of claim 3, wherein:
   the transistors of the three-level buck regulator comprise a mode transition field-effect transistor (MTF);
   the IC package further comprises at least one fourth connection terminal coupled to the MTF; and
   the at least one fourth connection terminal is coupled to the at least one second connection terminal via the second trace of the substrate.

10. The electric module of claim 1, wherein the transistors of the IC package comprise:
   a first transistor coupled between an input voltage (VIN) node and a first terminal of the capacitive element;
   a second transistor coupled between the first terminal of the capacitive element and the inductive element;

a third transistor coupled between the inductive element and a second terminal of the capacitive element; and a fourth transistor coupled between the second terminal of the capacitive element and a reference potential node of the three-level buck regulator.

11. A method for voltage regulation, comprising:

selectively coupling, via a plurality of transistors of a three-level buck regulator, a capacitive element between a switching node and a voltage rail or a reference potential node, the plurality of transistors being integrated in an integrated circuit (IC) package on a substrate; and generating an output voltage at an output node of the three-level buck regulator having an inductive element coupled between the switching node and the output node, the capacitive element and the inductive element being disposed adjacent to different sides of the IC package on the same layer of the substrate, wherein:

the capacitive element comprises a flying capacitor;

the different sides of the IC package comprise a first surface and a second surface, the first and second surfaces being adjacent surfaces sharing a common edge;

an entirety of a length of the capacitive element is disposed along the first surface; and an entirety of a length of the inductive element is disposed along the second surface.

12. The method of claim 11, wherein the capacitive element and the inductive element are disposed on the same layer of the substrate.

13. The method of claim 11, wherein the IC package comprises:

at least one first connection terminal coupled to a first terminal of the capacitive element via a first trace of the substrate;

at least one second connection terminal coupled to the switching node of the three-level buck regulator and coupled to the inductive element via a second trace of the substrate; and at least one third connection terminal coupled to a second terminal of the capacitive element via a third trace of the substrate.

14. The method of claim 13, wherein:

the at least one first connection terminal is located at a first side of a terminal pattern of the IC package;

the at least one second connection terminal is located at a second side of the terminal pattern different from the first side of the terminal pattern; and the at least one third connection terminal is located at the first side of the terminal pattern.

15. The method of claim 14, wherein:

the IC package comprises a ball grid array (BGA) package, the terminal pattern comprising a BGA pattern of the BGA package;

the at least one first connection terminal comprises at least one first ball located at the first side of the BGA pattern;

the at least one second connection terminal comprises at least one second ball located at the second side of the BGA pattern; and the at least one third connection terminal comprises at least one third ball located at the first side of the BGA pattern.

16. The electric module of claim 1, wherein a first terminal of the flying capacitor is coupled to a node between a first transistor and a second transistor of the three-level buck regulator, and wherein a second terminal of the flying capacitor is coupled to a node between a third transistor and a fourth transistor of a three-level buck regulator.

\* \* \* \* \*